(12) United States Patent
Top et al.

(10) Patent No.: US 8,608,070 B2
(45) Date of Patent: Dec. 17, 2013

(54) SYSTEMS AND METHODS TO DEFINE POSSIBLE ESD RISK

(75) Inventors: Mustafa Top, Foster City, CA (US); Stanley Weitz, Glenside, PA (US); Sonia Reed, Danville, CA (US)

(73) Assignee: Visa International Service Association, San Francisco, CA (US)

( * ) Notice: Subject to any disclaimer, the term of this patent is extended or adjusted under 35 U.S.C. 154(b) by 0 days.

(21) Appl. No.: 13/348,562

(22) Filed: Jan. 11, 2012

(65) Prior Publication Data

US 2012/0175420 A1    Jul. 12, 2012

Related U.S. Application Data

(60) Provisional application No. 61/431,665, filed on Jan. 11, 2011.

(51) Int. Cl.
   *G06K 7/00* (2006.01)
(52) U.S. Cl.
   USPC .......................................... 235/438; 235/492

(58) Field of Classification Search
   USPC .................. 235/438, 441, 491, 492, 486, 487
   See application file for complete search history.

(56) References Cited

U.S. PATENT DOCUMENTS

2008/0174315 A1* 7/2008 Top et al. ...................... 324/457
2010/0065637 A1* 3/2010 Top et al. ...................... 235/438

* cited by examiner

*Primary Examiner* — Thien M Le
(74) *Attorney, Agent, or Firm* — Kilpatrick Townsend & Stockton LLP

(57) ABSTRACT

Systems and methods for performing test procedures for measuring and defining the sensitivity of payment devices to ESD (electrostatic discharge) are disclosed. In some embodiments, a plurality of test equipment in a controlled environment are used to measure the peak discharge current (Ip) when a payment device is inserted into a charge/discharge device during several simulated conditions. Energy levels of the discharge currents are calculated using an energy calculation program. One or more reference current and energy levels are determined.

23 Claims, 10 Drawing Sheets

| # | Description of the measured/calculated value | Measured/ calculated value | Test procedure used to obtain the value |
|---|---|---|---|
| 1 | Capacitance of the magnetic stripe of the payment device and/or any conductive component that can touch the read head of the terminal during a normal swipe | <2.0pF | First test procedure |
| 2 | Capacitance of the contact interface plate if installed on the payment device | <2.0pF | First test procedure |
| 3 | Capacitance of the contactless interface if installed on the payment device | <5.0pF | First test procedure |
| 4 | Discharge current after normal operation | <250mA | Test procedure 2A |
| 5 | Discharge current when payment device is charged to 10kV | <250mA | Test procedure 2C |
| 6 | Discharge energy when payment device is charged to 10kV | <15nJ | Test procedure 2C |
| 7 | Dynamic resistance of he magnetic stripe of the payment device (measured using Ip = 10kV) | >5.0 KΩ | Third test procedure |
| 8 | Discharge current after rubbing the payment device on different types of fabric | <250mA | Test procedure 4D |

*FIG. 8*

SYSTEMS AND METHODS TO DEFINE POSSIBLE ESD RISK

CROSS-REFERENCES TO RELATED APPLICATIONS

The present application claims benefit under 35 U.S.C. §119(e) of U.S. Provisional Patent Application No. 61/431,665, entitled "Systems and Method to Define Possible ESD Risk," filed Jan. 11, 2011, the entire disclosure of which is incorporated herein by reference for all purposes.

BACKGROUND

ESD (Electrostatic Discharge) relates to sudden and momentary electric current that flows between two objects at different electrical potentials and is caused by direct contact or is induced by an electrostatic field. ESD sometimes occurs as a result of built up charges on a person or an object. When the person or an object comes in close proximity to a different electrical potential, a discharge occurs. The discharge produces a current pulse with a very fast rise time.

ESD at certain levels has the capability of damaging some electronic equipment. In particular, it is known that ESD may cause a temporary interruption or permanent damage to Point of Sale (POS) payment terminals used in payment transactions. Recently, the addition of more metal-based components or secure elements in or on payment devices such as debit or credit cards, has increased the risk of an ESD event that may be sufficient enough to disturb the payment transaction.

Therefore, a need for a solution as guidelines and testing methods for testing the payment devices (e.g credit and debit cards) has been raised. Embodiments of the invention address these and other problems, individually and collectively.

BRIEF SUMMARY

Systems and methods for performing test procedures for measuring and defining ESD susceptibility levels of payment devices are disclosed.

One embodiment of the invention is directed to the use of a plurality of test equipment and test systems in a controlled environment to measure a peak discharge current (Ip) when a payment device is inserted into a charge/discharge device during several simulated conditions.

Another embodiment of the invention is directed to performing a first test procedure by measuring a capacitance of a payment device using a capacitance measure fixture and a capacitance meter, measuring three current levels after perfuming a second test procedure, calculating the energy levels of the corresponding current levels using an energy calculation program, and calculating a dynamic resistance of the payment device from the current levels. The current levels are measured using a current transducer and an oscilloscope.

Another embodiment of the invention is directed to a charge/discharge device and an oscilloscope connected to the payment terminal. The current transducer measures a current when a payment device is inserted into the payment terminal.

Further details regarding embodiments of the invention are provided below in the Detailed Description and Claims.

BRIEF DESCRIPTION OF THE DRAWINGS

FIG. 8 illustrates a table with sample measurements from a test procedure, according to an embodiment of an invention.

DETAILED DESCRIPTION

Figure 1:
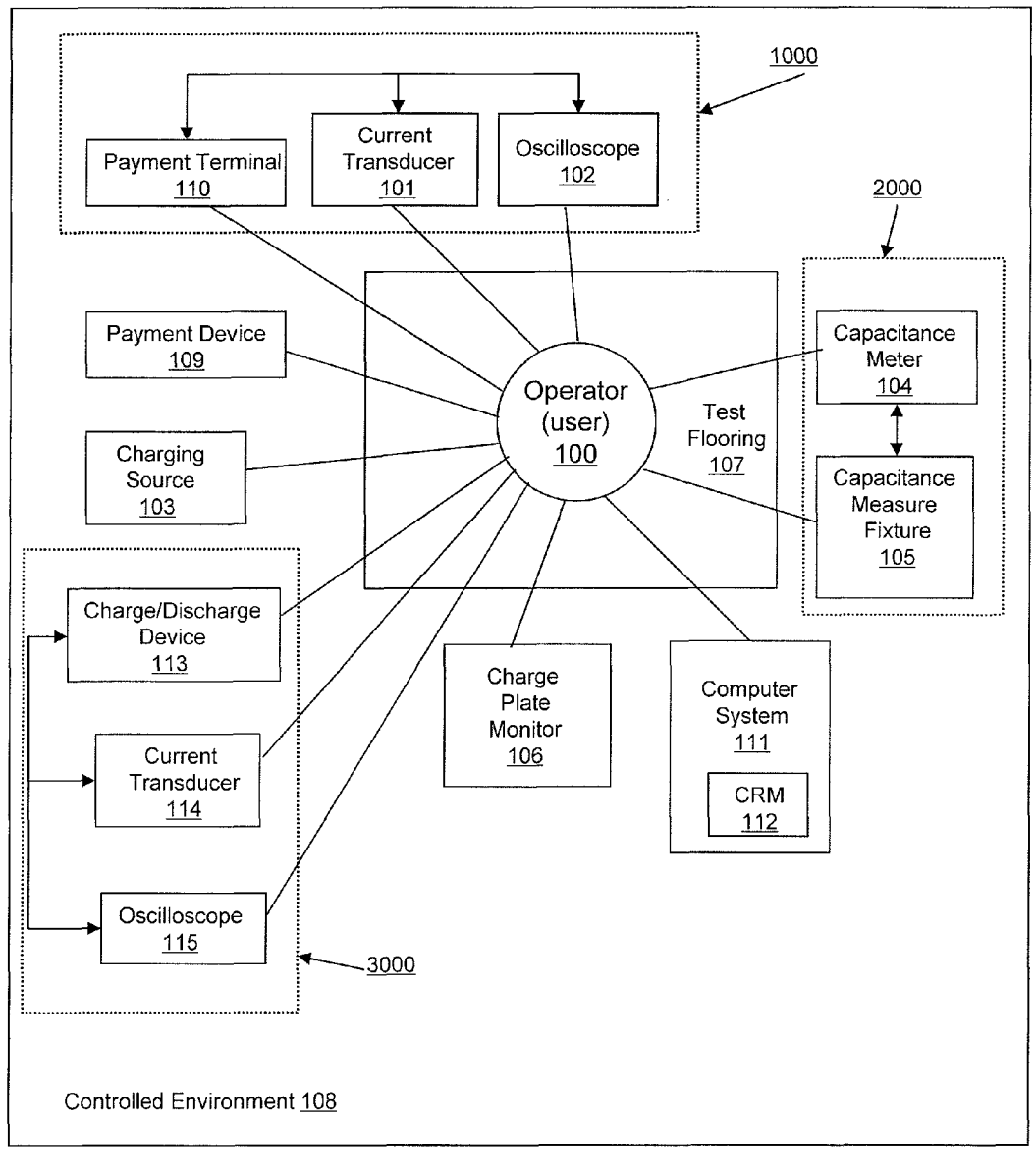
FIG. 1 illustrates the test equipment involved in the test procedures, according to an embodiment of the invention.

Embodiments of the invention disclosed herein include systems and methods for performing test procedures to define ESD susceptibility and risk levels of payment devices used to perform electronic payment transactions.

Embodiments of the invention allow the designers of payment devices to determine whether various capacitive and conductive components on the payment devices will result in current and energy levels that will cause interruption in a payment transaction or temporary/permanent damage to the payment devices and/or payment terminals.

In some embodiments, test methods for measuring the capacitance of the payment devices (also referred to as reference cards or test cards), and current levels that result from an ESD event under simulated conditions are disclosed. Also, methods for calculating the energy levels of the ESD event and dynamic resistance of the payment devices are also disclosed.

Measuring the capacitance of the payment device indicates the amount of charge that the payment device can hold. An ESD event may partially be related to the amount of charge that a payment device retains. Measuring the current levels and calculating the energy levels that result from an ESD event determines the current and energy levels that can be expected from the payment device in various conditions. Measuring the dynamic resistance of the payment device determines the ability of the payment device impede the occurrence of an ESD event.

In some embodiments, test methods evaluate the payment devices in a manner that replicates their use in the field by simulating a person who has become charged through certain activities and inserts a payment device into a payment terminal.

In some embodiments, test methods rely on the measurement of the peak discharge current (Ip) generated and its corresponding discharge energy when a payment device is charged to specific voltage levels and then inserted into a payment terminal.

Embodiments of the invention allow the manufacturers of the payment devices to measure some characteristics of the payment devices that may contribute to an ESD event (e.g.

capacitance and dynamic resistance of the payment devices) and determine the risk of the payment device to contribute to an ESD level that is beyond a threshold that a payment terminal can withstand. For example, a payment card may have a high capacitance due to a variety of conductive components such as antenna, hologram, microchip, etc. that are installed on the payment device. However, if the dynamic resistance of the payment device is high enough the likelihood of a strong ESD remains low. Embodiments of the invention advantageously allow the manufacturers of payment device to analyze and determine the risk of a payment device to contribute to an ESD event.

In the embodiments of the invention, a preparation step is performed prior to a series of test procedures. The preparation step is performed by placing a payment device (e.g. payment card), a charge/discharge device, a payment terminal and the test equipment, that are going to be used in the tests, in a control environment. The controlled environment conditions the payment device and test equipment by maintaining a relative humidity and temperature that simulates the operating conditions in the field.

After the preparation steps, a first test procedure is performed. This first test procedure is performed by measuring the capacitance of the conductive components (e.g. magnetic stripe, hologram, wireless antenna, etc.) of the payment device using a capacitance measure fixture and a capacitance meter. Capacitance is a measure of the amount of charge that can be stored in a given component on the payment device. This preparation step indicates the amount of charge that the payment device is capable of retaining.

A second test procedure is comprised of three sub-procedures which include measuring three current levels using the charge/discharge device, a current transducer and an oscilloscope. The current levels are the result of electrostatic discharge of the payment device when inserted into the charge/discharge device. The second test procedure comprise of normal insertion of the payment device into a charge/discharge fixture, insertion of the payment device into the charge/discharge device after performing a pre-defined physical activity (e.g. walking) to charge the payment device with electrostatic charge, and insertion of the payment device into the charge/discharge device after charging the payment device and the operator (user) to a predetermined voltage level (e.g. 10 kV). Also in this test, energy levels of each of the current levels are calculated. Calculating the energy levels is performed by a computer system running an energy calculation program.

A third test procedure is comprised of calculating the dynamic resistance of the payment device from one of the current levels that was measured in the second test procedure.

A fourth test procedure is comprised of four sub-procedures. The first three sub-procedures are similar to the second test procedure except a known ESD sensitive payment terminal is used instead of the charge/discharge device. The last sub-procedure is comprised of rubbing the payment device against various types of clothing martial (e.g. cotton, nylon, wool, and leather) and each time measuring the current level using the payment terminal that is known to be sensitive to electrostatic discharge, a current transducer and an oscilloscope.

In some embodiments, a reference current level equal to or greater than the highest of the current levels that are measured in the second test procedure is determined at the conclusion of the second test procedure. This reference current level becomes the actual reference threshold level that the payment devices can produce without causing a damage or malfunction to a payment terminal in an ESD event. Also, a corresponding energy level for each of the current levels from the second test procedure is calculated and a reference energy level equal to or greater than the highest of the energy levels is determined.

The systems, test equipment, test preparation methods and test procedures will now be described in detail with reference to the figures.

I. Systems

FIG. 1 shows the test equipment involved in the test procedure according to an embodiment of the invention. FIG. 1 shows operator 100, current transducer 101, oscilloscope 102, charging source 103, capacitance meter 104, capacitance measure fixture 105, charge plate monitor 106, test flooring 107, controlled environment 108, payment device 109, payment terminal 110, computer system 111, computer readable medium (CRM) 112, and charge/discharge fixture 113. In some embodiments, all of the above test equipment and the operator 100 are in the controlled environment 108, and the operator 100 stands on the test flooring 107 and uses the test equipment to perform the test procedures. FIG. 1 also shows the systems 1000, 2000 and 3000. In some cases, these systems may be subsystems in the system of FIG. 1. In system 1000, the payment terminal 110 is connected to the current transducer 101 and oscilloscope 102. In some embodiments, the current transducer 101 is connected to the outer shell of the low voltage power plug of the payment terminal. In system 2000, the capacitance measure fixture 105 is connected to the capacitance meter 104. The systems, test equipment, their functions, and the test procedure are described in detail below.

Although one operator 100 is shown in FIG. 1, any suitable number of people may collaborate during the test procedures.

The following test equipment may be used in the embodiments of the invention:

Current Transducer 101, 114: A device to detect the discharge pulse that occurs when the payment device 109 is discharged into the payment terminal 110.

Oscilloscope 102, 115: An oscilloscope that is capable of measuring fast rise time pulses.

Charging Source 103: A high voltage, low current power supply may be required to charge both the payment device 109 and the operator 100 performing the test, up to ±10 kV. The charging source is used to charge a payment device (e.g., a payment card) to a pre-specified voltage.

Capacitance Meter 104: A meter capable of measuring capacitance between 0.1 pF to 2 µF with 0.1 pF resolution using a test frequency of 1 kHz and an output voltage of 2.5 VAC, pk-pk.

Figure 2:
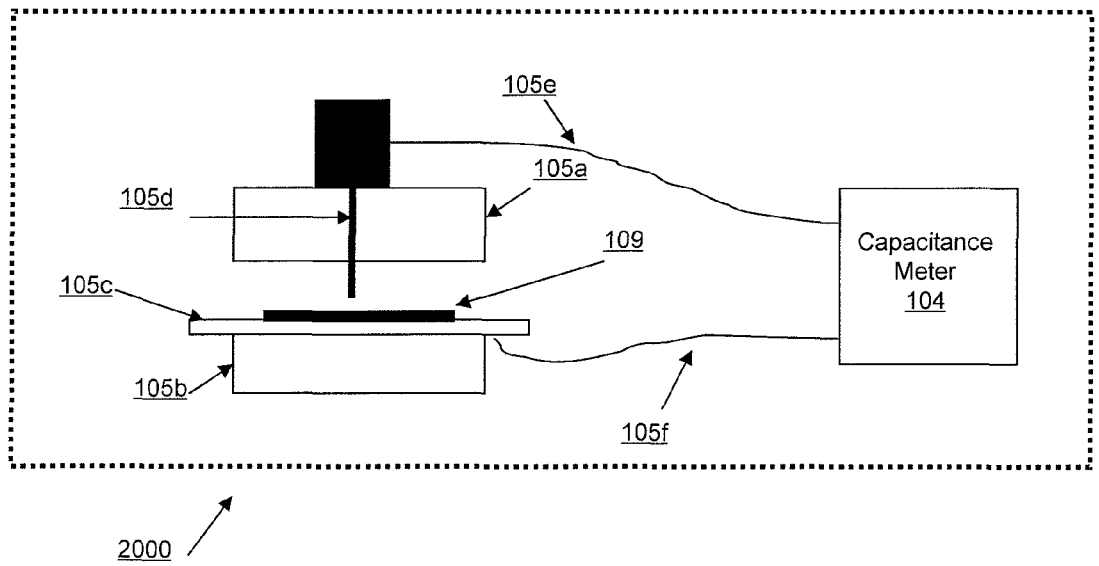
FIG. 2 shows a system, according to an embodiment of the invention.

Capacitance Measure Fixture 105: A device having a 5-lb (2.2 kg) probe as shown in FIG. 2. FIG. 2 shows system 2000 which is the capacitance measure fixture 105 connected to the capacitance meter 104. FIG. 2 shows the side view of the capacitance measure fixture 105. The capacitance measure fixture 105 has a top part 105a, a bottom part 105b, ground plane 105c, probe 105d (which in some embodiments may be a spring-loaded gold plated pointed electrode), and wires 105e and 105f. The payment device 109 is placed on the ground plane 105c such that the elements in the payment device that their capacitances are measured are in face up position. The ground plane 105c is then placed on the bottom part 105b. Wire 105e is connected to the probe at one end and to the capacitance meter 104 at the other end. The wire 105f is connected to the ground plane at one end and to the capacitance meter 104 at the other end. During the measurement, the probe 105d penetrates any insulated outer coating of the payment device to access the metal layer, if any, of the components of the payment device 109. The capacitance is then measured between that component and the ground plane.

Charge Plate Monitor 106: An instrument capable of measuring the voltage on a person performing a pre-defined activity such as walking. It should be capable of measuring up to ±10 kV.

Test flooring 107: A tile floor and nylon carpet approximately 1 m² (3×3 ft). The floor should not have been treated with any type of static control such as fibers, coatings, etc. They must be capable of generating at least +2 kV and −2 kV respectively when a person wearing sneakers takes a minimum of 3 steps.

Controlled Environment 108: An enclosed area that is capable of maintaining a relative humidity of 12±3% RH and temperature of 23±3° C. (71±2° F.). It should be sufficiently large to allow a person (operator) to perform the required tests. These test conditions are those specified for low humidity ESD testing of military and commercial electronic devices.

Payment device 109, also referred to as a portable consumer device or reference card, refers to any suitable device that allows a payment transaction to be conducted with a merchant. Payment device 109 may be in any suitable form. For example, suitable payment device 109 can be hand-held and compact so that they can fit into a consumer's wallet and/or pocket (e.g., pocket-sized). They may include smart cards, magnetic stripe cards, keychain devices (such as the Speedpass™ commercially available from Exxon-Mobil Corp.), etc. In some cases, payment device 109 may be associated with an account of a user (card holder) such as a bank account.

Payment terminal 110, also referred to as the Point of Sale device (POS) or access device, may be any suitable device for communicating with a merchant and for interacting with payment device 109. Payment terminal 110 can be in any suitable location such as at the same location as the merchant. Payment terminal 110 may be in any suitable form. Some examples of payment terminal 110 include POS devices, cellular phones, PDAs, personal computers (PCs), tablet PCs, hand-held specialized readers, set-top boxes, electronic cash registers (ECRs), automated teller machines (ATMs), kiosks, security systems, access systems, and the like. Payment terminal 110 may use any suitable contact or contactless mode of operation to send or receive data from payment terminal 110. The payment terminal 110 receives the account data from the payment device 109 and generates an authorization request message.

Figure 4A:
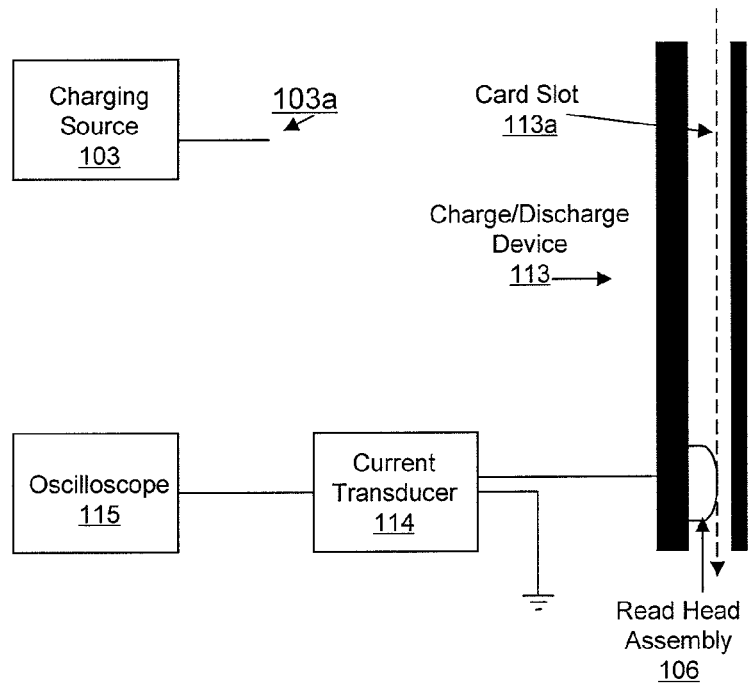
FIG. 4a shows a system, according to an embodiment of the invention.
Figure 4B:
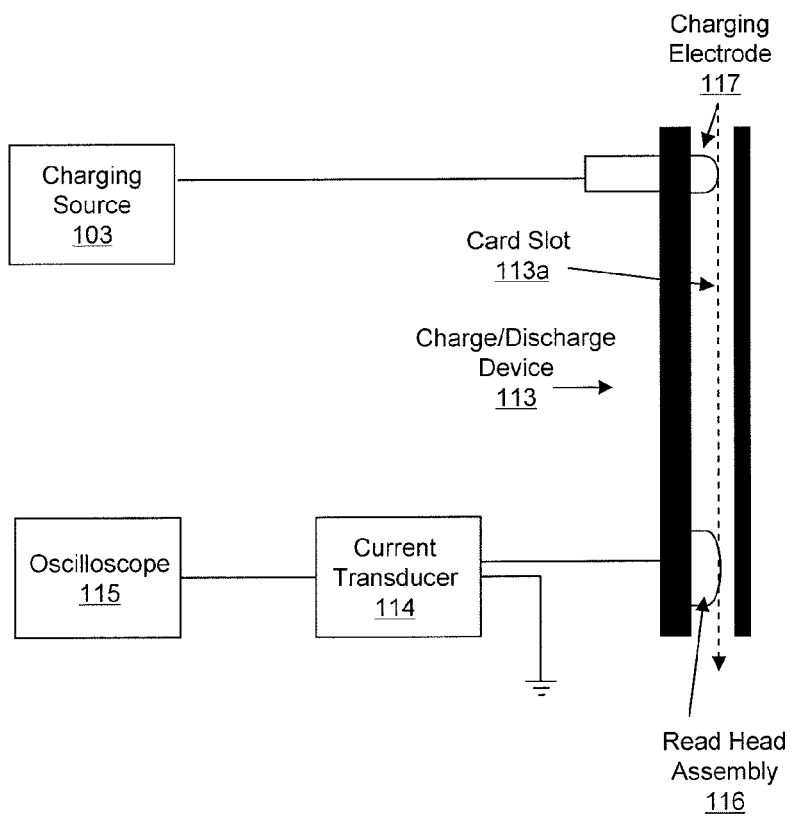
FIG. 4b shows a system, according to an embodiment of the invention

Charge/discharge fixture 113 is shown in FIGS. 4a and 4b. This device simulates the process of sliding a payment device in a Point of Sale terminal device. Also, it can be used for charging and/or discharging the payment device. Referring to FIG. 4a, the charge discharge/fixture 113 comprises of the card slot 113a and read head assembly 106. The charge/discharge fixture is connected to the current transducer 101 and oscilloscope 115 to form the system 3000.

Figure 3:
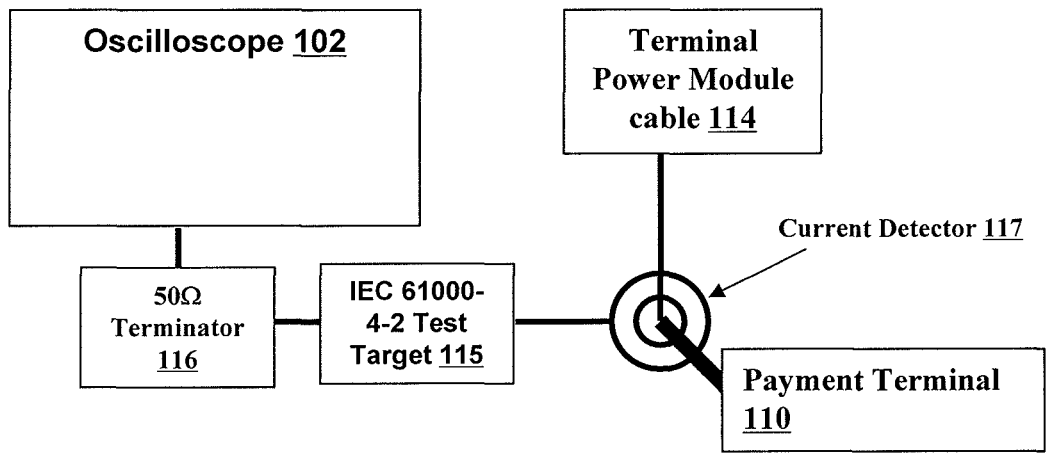
FIG. 3 shows the process of connecting an oscilloscope to a payment terminal according to an embodiment of the invention.

FIG. 3 shows an exemplary process of connecting the payment terminal 110 to the oscilloscope 102 according to an embodiment of the invention. As shown in FIG. 3, a low voltage connector from the payment terminal power module cable 114 is passed through a ¼" ID lug of the current detector 117 and then plugged into the 5 mm power input jack of the payment terminal 110. It will be understood by those skilled in the art that other types of power connections may need a special adapter design. At this point, the lead from the current detector 117 is plugged into IEC 61000-4-2 test target or similar type transducer 115 which detects the discharge pulse that is present on the outer shell of the power plug when a charged payment device is inserted or swiped in the payment terminal 110. IEC 61000-4-2 test target 115 converts the discharge pulse signal to a current pulse. The output of the IEC 61000-4-2 test target 115 has a 50 ohm impedance. Therefore, the 50 ohm terminator 116 is used to match the 50 ohm output impedance of the IEC 61000-4-2 test target 115 to the 1 megaohm input impedance of the oscilloscope 102. The oscilloscope 102 detects the current pulse and displays and records the waveform. In some embodiments, the oscilloscope 102 setting are typically a time base of 10 nsec/div and 5-50 mA/div for payment devices not charged and 50-2000 mA/div for payment devices that have been charged. Also, in some embodiments, trigger levels are typically set at 1 division of the vertical sensitivity selected. For example, at 50 mV/div, trigger level is set at 50 mV. It will be understood by those skilled in the art that other settings may apply.

II. Methods

The methods of measuring the peak discharge current (Ip) resulting from a simulated electrostatic discharge, calculating the energy of the discharge current, and calculating the dynamic resistance of the payment device are described with reference to the figures.

Figure 5:
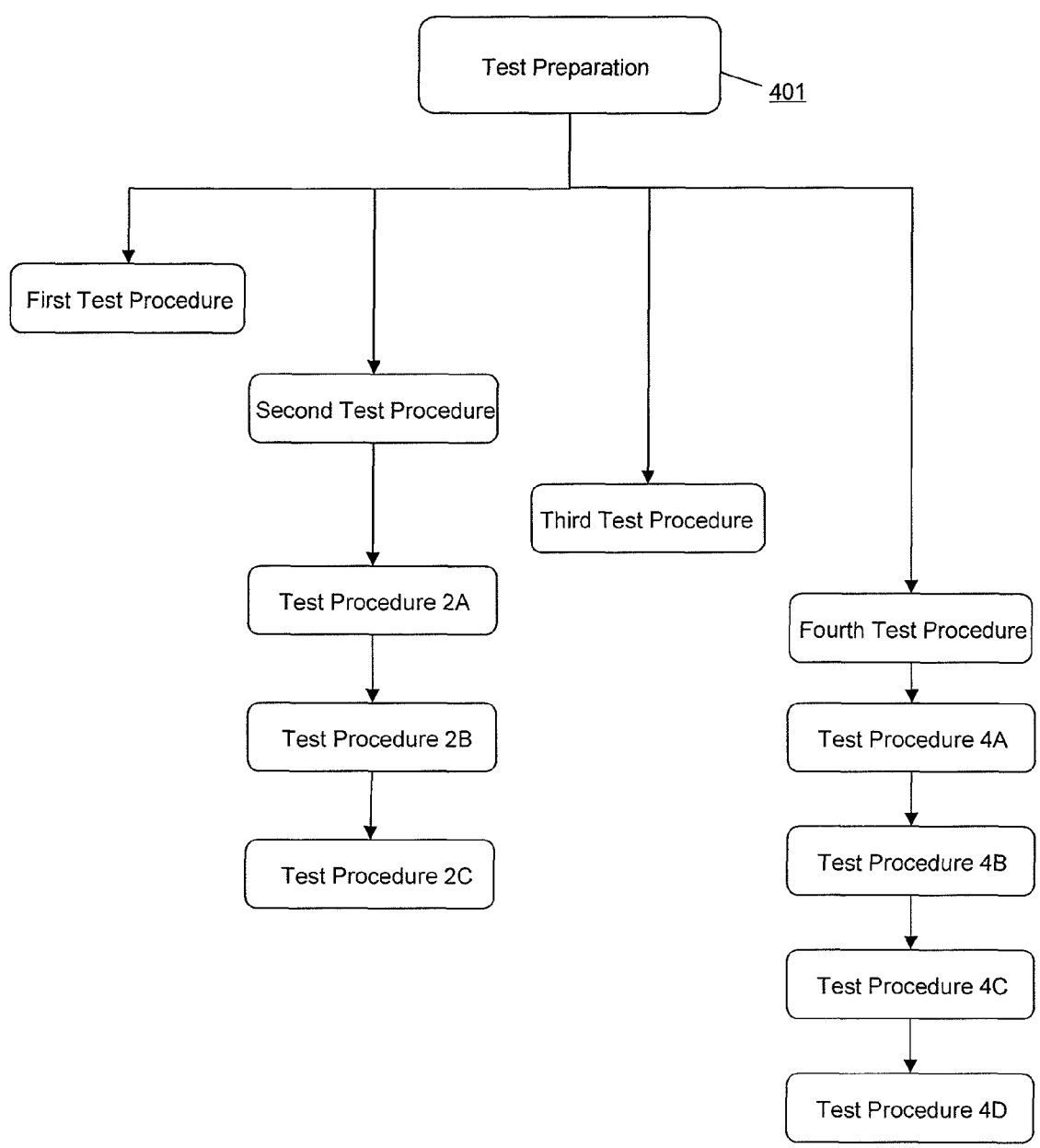
FIG. 5 shows a flowchart that illustrates the overall view of the test procedures according to an embodiment of the invention.

FIG. 5 is a flowchart that illustrates the high level approach in defining ESD susceptibility of payment devices. As shown in FIG. 5, a test preparation procedure is performed and then a number of test procedures are performed.

A. Test Preparation

In some embodiments, the payment device 109 and the payment terminal 110 are conditioned in the controlled environment 108 for a minimum of 48 hours prior to test.

B. Test Procedures

First, second, third, and fourth test procedures shown in FIG. 5 will now be described with reference to the figures.

First Test Procedure

In the first test procedure, the capacitance of all individual components of the payment device 109 is measured. More specifically, the capacitance of the payment device components such as magnetic stripe, hologram image, and any other conductive material are measured. The capacitance of the payment device is a measure of the amount of charge that can be stored in a given component on the payment device 109. It has been found that a capacitance greater that 6 pF when charged to 5 kV contains sufficient energy to disrupt a payment terminal known to be ESD sensitive. Capacitance of the contact/contactless component of a payment device 109, typically range from 20-50 pF due to the associated electronics imbedded within the payment card 109.

In some embodiments, the capacitance is measured using the system 2000 shown in FIG. 2. The payment device 109 is placed on the ground plane 105c of the capacitance measure fixture 105 such that the elements in the payment device 109 whose capacitances are going to be measured are accessible by the probe 105d. The ground plane 105c is then placed on the bottom part 105b. The capacitance meter 104 should first be set to zero. The pointed electrode is placed on an unobstructed portion of the payment device 109 and then the ZERO control of the capacitance meter 104 is adjusted until the meter reads "0.0". The payment device 109 is moved so that the pointed electrode of the probe 105d is over the component to be measured. The point of the probe 105d penetrates any insulated outer coating to access the metal layer, if any, of a component of the payment device 109. The capacitance is then measured between that component and the ground plane 105c. The above procedure is repeated using several locations around the respective component on the payment device 109. Also, the capacitance of the magnetic stripe and any marks on the payment device 109 are measured. In some embodiments, the capacitance of the buried components such as an antenna may be measured, among other methods, by applying additional pressure to the capacitance measure fixture so as to penetrate the outer laminate layer of the payment device 109.

In some embodiments, the capacitance of the card may be measured by the capacitance meter 104 and without the use of the capacitance measure fixture 105. However, it is appreciated that the capacitance measure fixture may advantageously be used for better accessibility of the probe 105*d* to measure some of the components of to the payment device 109.

Second Test Procedure

The second test procedure comprise of three sub-procedures that may be performed in any order.

Test Procedure 2A

In this test procedure, the peak discharge current (Ip) (first current level) is measured, and energy of the discharge (first energy level) is calculated when the payment device 109 is inserted into the charge/discharge device 113 with minimal operator activity. Prior to insertion, the operator should touch ground first to remove any residual charge. The goal of this test is to measure a discharge current during a normal operation for comparison purposes. Normal insertion of the payment device 109 into the charge/discharge device 113, typically generates a peak discharge current that can range from just a few milliamps (mA) to over 250 mA.

Referring to FIG. 4*a*, the payment device is inserted in the card slot 113*a* and the discharge is captured by the read head assembly 106. The read head assembly 106 then transfers the voltage to the current transducer 101 that in turn passes it to the oscilloscope 115.

Figure 6:
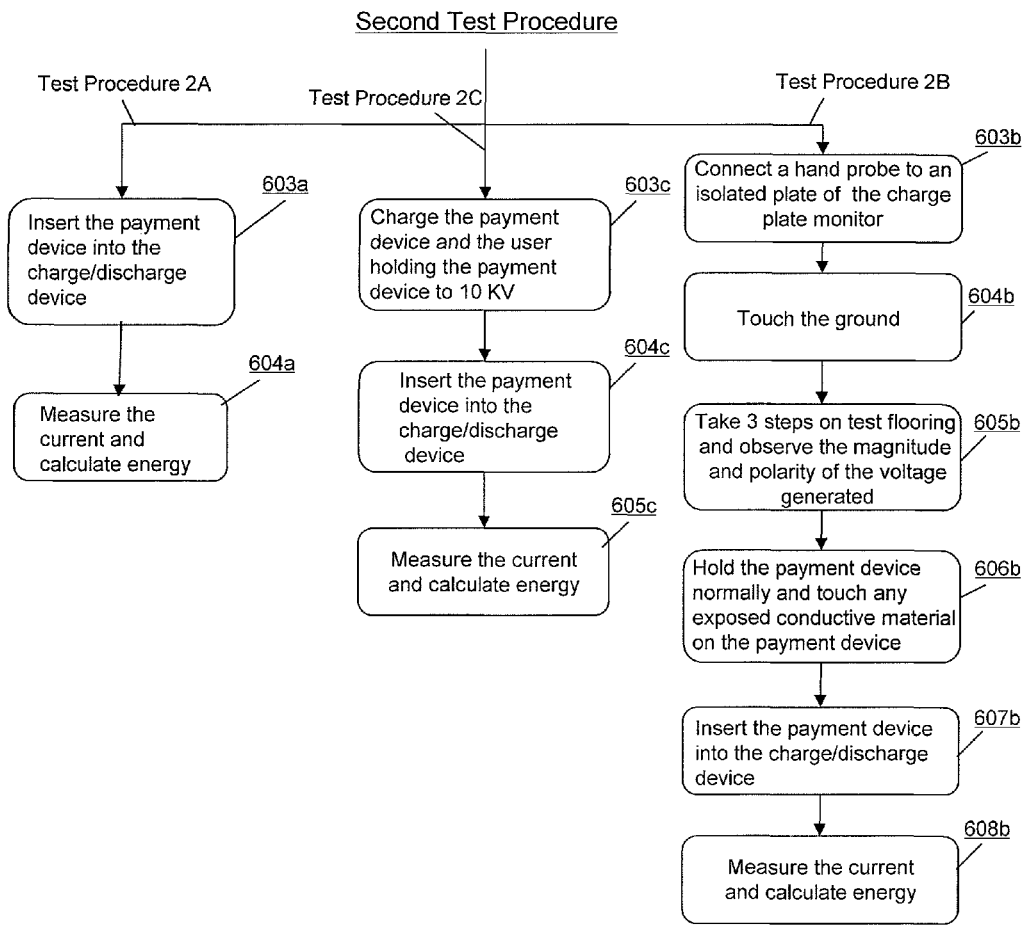
FIG. 6 illustrates a test procedure, according to an embodiment of an invention.

FIG. 6 illustrates the steps involved in this test procedure. In step 603*a*, the operator (user) 100 inserts the payment device 109 into the charge/discharge fixture 113 that is part of the system 3000 (shown in FIG. 4*a*). In this test procedure, the operator 100 should not move or take any action before the payment device 109 is inserted into the charge/discharge device 113. In step 604*a*, the operator 100 uses the current transducer 114 and oscilloscope 115 to measure the peak discharge current (Ip). The measurements performed by the oscilloscope 115 may then be supplied to an energy calculation program running on the computer system 111 to calculate the energy of the discharge. In some embodiments, the CSV data from the oscilloscope 115 in system 3000 are provided to an energy calculation program as a CSV data file. The CSV (Comma Separated Values) file is a specially formatted plain text file which stores measured values from the oscilloscope 115. In one embodiment, the computer system 111 may be coupled to the oscilloscope 115 in system 3000 and the CSV file may be directly supplied to the energy calculation program from the oscilloscope 115 when the payment device 109 is inserted into the charge/discharge device 113.

In one embodiment, the energy calculation program uses the following formula to calculate the energy of the peak discharge current (Ip), where the resulting energy is expressed in nanojoules (nJ) or microjoules (µJ).

Where:

$$\text{Energy} = R \times t \times \sum_{i=1}^{n} I_i^2$$

-continued $R$ = value of the circuit resistance
$t$ = time between samples
$I$ = current from probe (voltage/5 for $CT - 1$)
$n$ = total number of samples Test Procedure 2B In this test procedure, the peak discharge current (Ip) is measured when the operator 100, wears a particular type of footwear (e.g., sneakers) and performs a certain pre-defined physical activity (e.g., operator 100 walks across a test floor). The goal of this test is to simulate a build up of charge on the payment device through certain user activity such as walking up to a payment terminal while holding the payment device 109.

FIG. 6 illustrates the steps required to perform this test procedure. In step 603*b*, a hand probe is connected to the operator 100 and an isolated plate of the charge plate monitor 106. In step 604*b* the operator 100 touches the ground. In step 605*b*, operator 100 takes three to five steps on the test flooring 107 and observes the magnitude and polarity of the voltage generated using the charge plate monitor 106. Other test sequences may also be used. The test flooring 107 can be comprised of two kinds of materials which can be tile flooring and nylon carpet. Walking on the tile flooring generates a positive voltage and walking on the nylon carpet generates a negative voltage. Other types of flooring can be used in other embodiments of the invention. The operator 100 performs this test procedure using both the title flooring and the nylon carpet, one at a time. For example, the operator 100 may first perform the test procedure by walking on title flooring and then repeat the test procedure by walking on carpet flooring, or vice versa.

If the proper voltage level and polarity are generated (step 605*b*), the operator 100 holds the payment device 109 normally and any exposed conductive component of the payment device is touched 109 (e.g, metallic logo, security chip, etc.) (step 606*b*). The magnitude of the voltage generated by the activities of the operator 100 should be about 2-5 kV and the polarity of the voltage depends on the type of the test flooring 107 and/or footwear (i.e. tile flooring=positive voltage and nylon carpet=negative voltage).

If the proper voltage is not reached, the operator 100 changes the footwear or takes additional steps on the test flooring 107. The operator 100 may also change his footwear and take additional steps with the new footwear to reach the desired voltage level.

Walking on the test flooring while touching a conductive part of the payment device 109 results in a worst case scenario in the build up of charge on the payment device 109. The steps performed in the flowchart of FIG. 6, determines if walking on the test flooring 106 produces the desired level of charge that can be transferred to the payment device 109 via the operator 100.

Referring to the flowchart of FIG. 6 and FIG. 4*a*, in step 607*b* the operator 100 inserts the payment device 109 into the charge/discharge device 113. In step 608*b*, the peak discharge current (Ip) (second current level) is measured by using the system 3000 and the energy of the discharge current (second energy level) is calculated by the energy calculation program discussed above.

Test Procedure 2C

In this test procedure, the payment device is charged to a predetermined voltage depending on its martial (i.e. plastic or metal cards) and the peak current (Ip) is measured and its energy level is calculated.

As shown in the flowchart of FIG. 6, in step 603c, the payment device 109 and the operator 100 are charged to 5 or 10 kV via the charging source 103. Referring to FIG. 4a, to charge the payment device 109, the operator 100 stands on an insulated surface to prevent any charge from bleeding off to ground. The operator 100 holds the payment device 109 normally, sets the charging source 103 to 5 or 10 kV, touches the conductive components of the payment device such as the contact/contactless pad of the payment device 109 to the output 103a of the charging source 103, and then immediately inserts the payment device 109 into the card slot 113a of the charge/discharge device 113 (step 604c). Alternatively, as shown in FIG. 4b, the payment device 109 can be charged via the charging electrode 117 which is connected to the charging source 103. In some embodiments, other voltage levels may also be used.

The operator 100 then measures the peak discharge current (Ip) (third current level) and calculates the energy (using the energy calculation program) of the discharge (third energy level) that caused disruption (step 605c). This measurement is done similar to the measurement discussed above (step 604a).

In this test procedure, if the material of the payment device 109 is metal, in some embodiments, the payment device 109 and the operator may be charged to 1 KV or some other lower voltage level.

Third Test Procedure

In the third test procedure, the dynamic resistance of the payment device 109 is calculated from the current measurements obtained from the above test procedures. The dynamic resistance of the payment device determines the level of conductivity of the payment device. The higher the dynamic resistance, the lower the chance that an ESD will occur. Therefore, a high dynamic resistance value is desirable.

In this procedure, the dynamic resistance is calculated by dividing the charging voltage such as 5 or 10 kV (i.e 5,000 or 10,000 v) by the measured peak current (Ip) in test procedure 2C (i.e. Rd=10,000(V)/Ip(A)). Also, for metal cards, 1 kV is typically used instead of 10 Kv for calculating the dynamic resistance (Rd), but it is understood that other voltages can be used. In a typical situation, the payment device 109 becomes charged and when swiped, it discharges the accumulated charge to the read head of a payment terminal. Therefore, the dynamic resistance is calculated using the peak charge current pulse from a charged payment device.

Fourth Test Procedure

The fourth test procedure comprise of four sub-procedures that may be performed in any order. The first three sub procedures (test procedures 4A, 4B and 4C) are similar to the test procedures 2A, 2B and 2C respectively, except the payment device 109 is swiped through a known ESD sensitive payment terminal instead of the charge/discharge device 113. This test procedure allows the operator to determine if the charge that is build up on the payment device 109 results in failure symptoms of any kind (e.g. loss of power) in the payment terminal 110. This test procedure can determine whether the payment device is likely to contribute to an ESD event. For example, from the first test procedure it may be determined that the capacitance of the payment device is quite high (which increases the risk of an ESD event). Also from the third test procedure it may be determined that the dynamic resistance of the payment device is quite high (which reduces the risk of an ESD event). By performing the fourth test procedure, it can be determined whether the overall characteristics of the payment device could cause a terminal disruption.

Test Procedure 4A

In this test procedure, the peak discharge current (Ip) (first current level) is measured, and energy of the discharge (first energy level) is calculated when the payment device 109 is inserted into the payment terminal 110 with minimal operator activity. Prior to insertion, the operator should touch ground first to remove any residual charge. The goal of this test is to measure a discharge current during a normal operation for comparison purposes. Normal insertion of the payment device 109 into the payment terminal 110, typically generates a peak discharge current that can range from just a few milliamps (mA) to over 250 mA.

Figure 7:
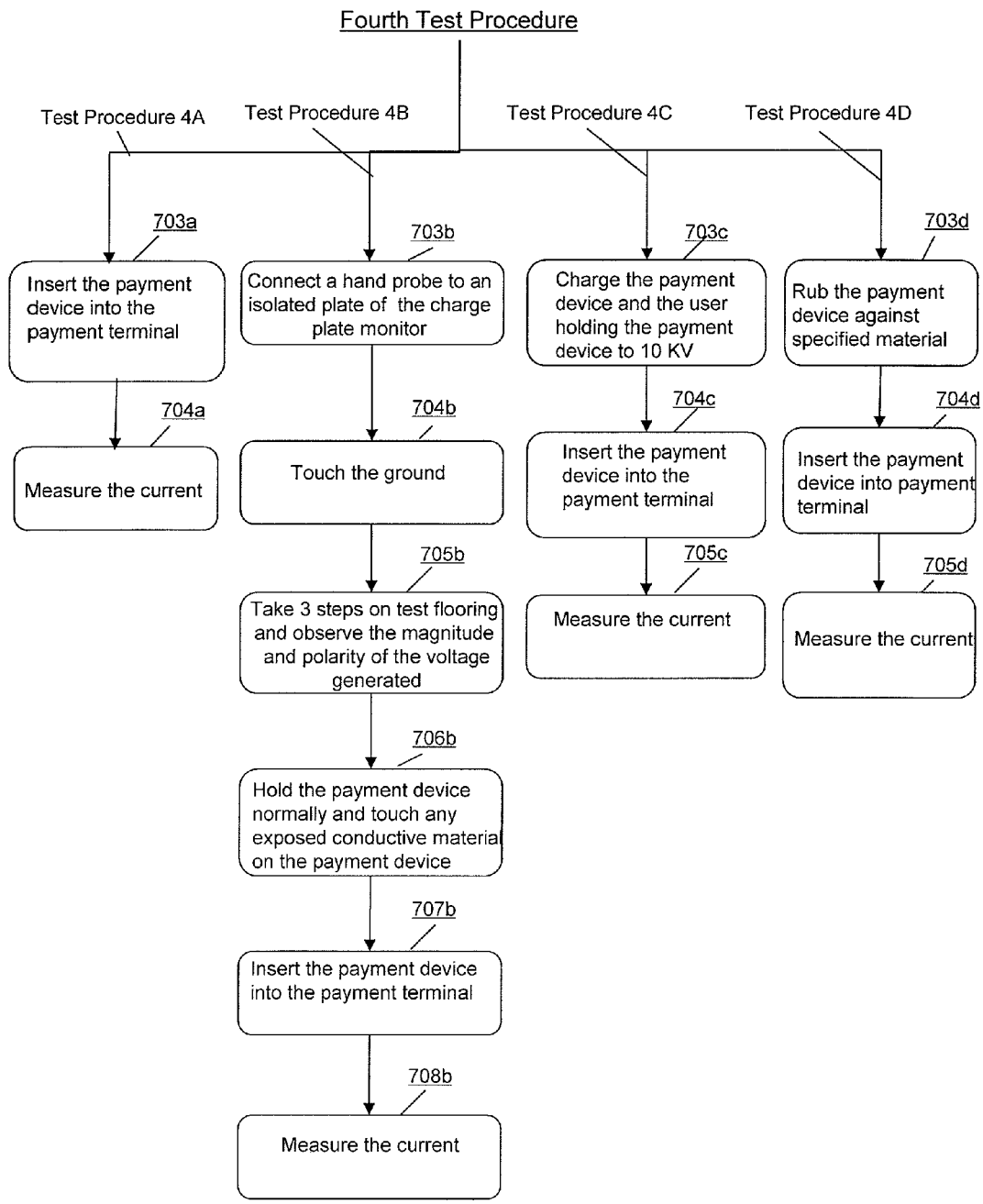
FIG. 7 illustrates a test procedure, according to an embodiment of an invention.

FIG. 7 illustrates the steps involved in this test procedure. In step 703a, the operator (user) 100 inserts the payment device 109 into the payment terminal 110 that is part of the system 1000. In this test procedure, the operator 100 should not move or take any action before the payment device 109 is inserted into the payment terminal 110. In step 704a, the operator 100 uses the current transducer 101 and oscilloscope 102 to measure the peak discharge current (Ip).

Test Procedure 4B

In this test procedure, the peak discharge current (Ip) is measured when the operator 100, wears a particular type of footwear (e.g., sneakers) and performs a certain pre-defined physical activity (e.g., operator 100 walks across a test floor). The goal of this test is to simulate a build up of charge on the payment device through certain user activity such as walking up to a payment terminal while holding the payment device 109.

FIG. 6 illustrates the steps required to perform this test procedure. In step 603b, a hand probe is connected to the operator 100 and an isolated plate of the charge plate monitor 106. In step 704b the operator 100 touches the ground. In step 705b, operator 100 takes five steps on the test flooring 107 and observes the magnitude and polarity of the voltage generated using the charge plate monitor 106. The test flooring 107 can be comprised of two kinds of materials which can be tile flooring and nylon carpet. Walking on the tile flooring generates a positive voltage and walking on the nylon carpet generates a negative voltage. Other types of flooring can be used in other embodiments of the invention. The operator 100 performs this test procedure using both the title flooring and the nylon carpet, one at a time. For example, the operator 100 may first perform the test procedure by walking on tile flooring and then repeat the test procedure by walking on carpet flooring, or vice versa.

If the proper voltage level and polarity are generated (step 705b), the operator 100 holds the payment device 109 normally and any exposed conductive component of the payment device is touched 109 (e.g, metallic logo, security chip, etc.) (step 706b). The magnitude of the voltage generated by the activities of the operator 100 should be about 2-5 kV and the polarity of the voltage depends on the type of the test flooring 107 and/or footwear (i.e. tile flooring=positive voltage and nylon carpet=negative voltage).

If the proper voltage is not reached, the operator 100 changes the footwear or takes additional steps on the test flooring 107. The operator 100 may also change his footwear and take additional steps with the new footwear to reach the desired voltage level.

Walking on the test flooring while touching a conductive part of the payment device 109 results in a worst case scenario in the build up of charge on the payment device 109. The steps performed in the flowchart of FIG. 5, determines if walking on the test flooring 106 produces the desired level of charge that can be transferred to the payment device 109 via the operator 100.

Referring to the flowchart of FIG. 6, in step 707b the operator 100 inserts the payment device 109 in to the charge/ discharge device 113. In step 708b, the peak discharge current (Ip) (second current level) is measured by using the system 1000.

Test Procedure 4C

In this test procedure, the payment device 109 is charged to a predetermined voltage depending on its material (i.e. plastic or metal cards) and the peak current (Ip) is measured and its energy level is calculated.

As shown in the flowchart of FIG. 6, in step 703c, the payment device 109 and the operator 100 are charged to 10 kV via the charging source 103. To charge the payment device 109, the operator 100 stands on an insulated surface to prevent any charge from bleeding off to ground. Referring to FIG. 4a, the operator 100 holds the payment device 109 normally, sets the charging source 103 to 10 kV or other level, touches the conductive components of the payment device such as the contact/contactless pad of the payment device 109 to the output of the charging source 103, and then immediately inserts the payment device 109 into the slot of the payment terminal 110 (step 704c).

The operator 100 then measures the peak discharge current (Ip) (third current level) and calculates the energy (using the energy calculation program) of the discharge that caused disruption (step 705c). This measurement is done similar to the measurement discussed above (step 604a).

In this test procedure, if the material of the payment device 109 is metal, the payment device 109 and the operator are charged to 1 KV.

Test Procedure 4D

In this test procedure, the payment device 109 is rubbed against four kinds of martial (cotton, nylon, wool, and leather) (step 703d) and then inserted into an ESD sensitive payment terminal (step 704d) and the peak discharge current (Ip) is measured (step 705d). This test procedure simulates the buildup of charge that may be caused by different clothing fabrics.

Additional Test Procedures

In some embodiments additional test procedures (5A-5D) may be performed for increased accuracy. The following test procedures may be conducted in addition or instead of any one of the test procedures described above and may be performed in any order.

Test Procedure 5A

In this test procedure the operator 100 holds a payment device 109 and performs the following tasks:
1. Selects a voltage level up to 10 kV on a specially configured High Voltage Power Supply (e.g. charging source 103) that limits the maximum current output to 100 microamperes at 10 kV.
2. Touches the output of the High Voltage Power Supply for approximately 1 second.
3. Immediately swipes the payment device 109 through the charge/discharge fixture 113.

Referring to FIG. 4a, the read head assembly 116 is connected to a current transducer 101 via a short wire approximately 6" (152 mm) long. The current transducer 101 converts the voltage pulse to a current pulse generated when the payment device and/or its component such as the magnetic stripe, premium brand mark (e.g. a bank logo), contact/contactless element touches the read head assembly 116. The current transducer 114 connects to a high speed oscilloscope 115 having at least a 200 MHz bandwidth and a 2 Gs/sec sampling rate. The current waveform is displayed on the oscilloscope display and the digital data is stored in a flash drive or other storage devices (not shown). The data for each current pulse measured and recorded is transferred to a computer system 111 where a program on the CRM 112 is used to calculate the energy (E) contained within the current pulse as described above.

Test Procedure 5B

Referring to FIG. 4a, in this test procedure the operator while holding the payment device 109, touches the output 103a of the charging source 103 and performs the following and measures the current pulse as described in Test Procedure 5A above:
1. Selects a voltage level up to (10 kV on a specially configured High Voltage Power Supply (e.g. charging source 103) that limits the maximum current output to 100 microamperes at 10 kV.
2. Touches the output 103a of the High Voltage Power Supply for approximately 1 second.
3. Immediately swipes the payment device through the charge/discharge fixture 113.

Test Procedure 5C

Figure 9A:
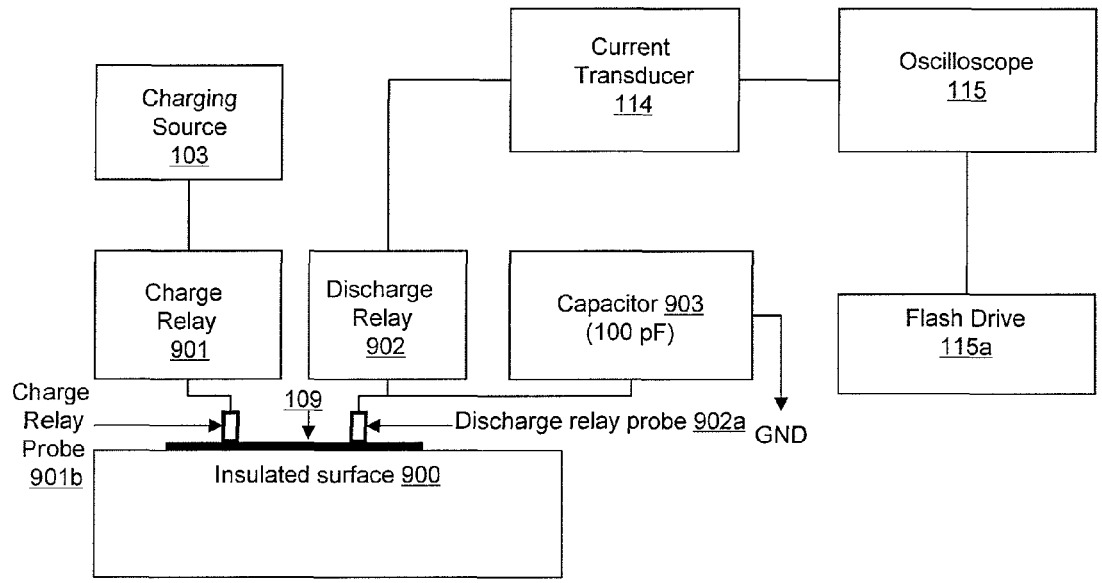
FIG. 9a shows a system, according to an embodiment of the invention.

Referring to FIG. 9a, in this test procedure, the payment device 109 is placed on the insulated surface 900. In one embodiment, the dimensions of the insulated surface may be 6×6" (152×152 mm). The payment device 109 then contact the probe 902a of the discharge relay 902 and the probe 901a of the charge relay 901. Also, a 100 pf capacitor is connected to the probe of the discharge relay 902a to simulate a person holding the payment device 109. The discharge relay 902 is connected to the current transducer 114 (via a short wire approximately 6" (152 mm) long). Current transducer 114 is connected to the oscilloscope 115. Oscilloscope 115 is a high speed Oscilloscope having at least a 200 MHz bandwidth and a 2 Gs/sec sampling rate. A flash drive or other storage device is connected to the oscilloscope 115 and 115a. The charge relay 901 is connected to the charging source 103. The payment device 109 is then tested as follows:
1. A voltage level up to 10 kV on a specially configured High Voltage Power Supply (e.g. charging source 103) that limits the maximum current output to 100 microamperes at 10 kV is selected.
2. The charge relay probe 901a is placed on a payment device component such as the magnetic stripe, premium mark, contact/contactless plate etc.
3. The discharge relay probe 902a is placed on either the same component or a different component or the payment device body.
4. The selected voltage from the charging source 103 is then applied for approximately 1 second by activating the charge relay probe 902b.
5. After the 1 second charging time the discharge relay 902 is then activated, discharging the component.
6. The current transducer 114 converts the voltage pulse to a current pulse generated when the charged payment device and/or component such as the magnetic stripe, premium brand mark, contact/contactless plate etc is discharged.
7. The data for each current pulse measured and recorded is transferred to a computer system 111 where a program on the CRM 112 is used to calculate the energy (E) contained within the current pulse.

Test Procedure 5D

Figure 9B:
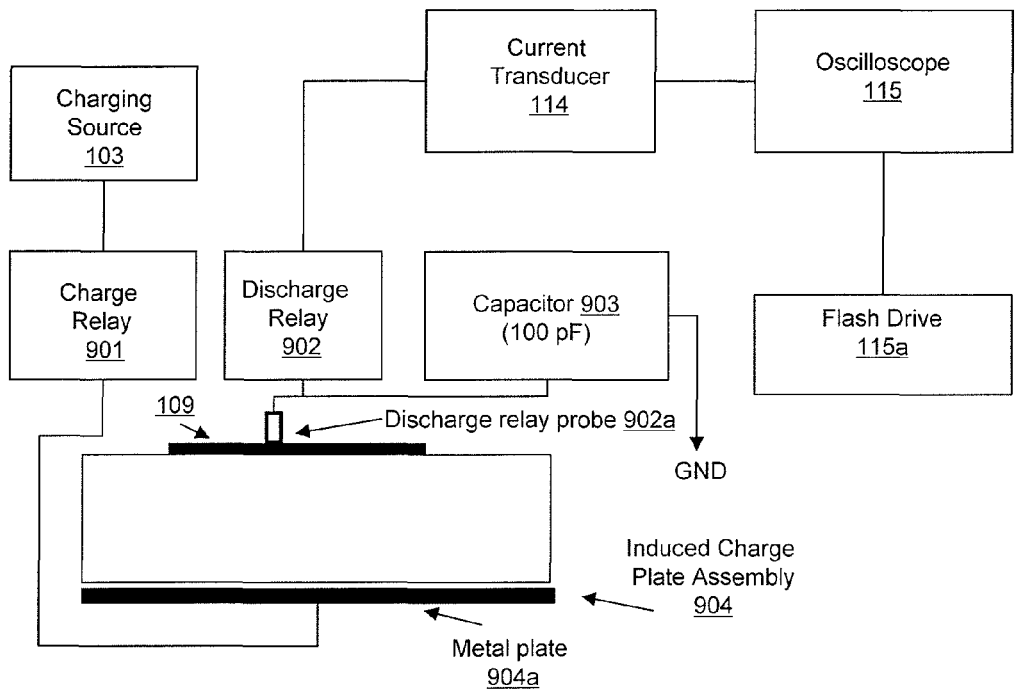
FIG. 9b shows a system, according to an embodiment of the invention.

Referring to FIG. 9b, the payment device is placed on the induced charge plate assembly 904. In one embodiment, the dimensions of the induced charge plate assembly 904 may be 6×6" (152×152 mm) with a 3 millimeter or lesser insulated surface. The payment device 109 then contacts the probe 902a of the discharge relay 902. The probe 901a of the charge relay 901 is connected to the metal plate 904a which charges the payment device 109 through induction. Also, a 100 pf capacitor is connected to the probe of the discharge relay 902a to simulate a person holding the payment device. The discharge relay 902 is connected to the current transducer 114 (via a short wire approximately 6" (152 mm) long). Current transducer 114 is connected to the oscilloscope 115. Oscilloscope 115 is a high speed Oscilloscope having at least a 200 MHz bandwidth and a 2 Gs/sec sampling rate. A flash drive or other storage device is connected to the oscilloscope 115 and 115a. The charge relay is connected to the charging source 103. The payment device is then tested as follows:

1. A voltage level up to 10 kV on a specially configured High Voltage Power Supply (e.g. charging source 103) that limits the maximum current output to 100 microamperes at 10 kV is selected.
2. The discharge relay probe 902a is placed on either on a component or the payment device body.
3. The selected voltage from the charging source 103 is then applied for approximately 1 second by activating the charge relay probe 902b.
4. The current transducer 114 converts the voltage pulse to a current pulse generated when the charged payment device and/or component such as the magnetic stripe, premium brand mark, contact/contactless plate etc is discharged.
5. The current transducer 114 converts the voltage pulse to a current pulse generated when the charged payment device and/or component such as the magnetic stripe, premium brand mark, contact/contactless plate etc is discharged.
6. The data for each current pulse measured and recorded is transferred to a computer system 111 where a program on the CRM 112 is used to calculate the energy (E) contained within the current pulse.

FIG. 8 illustrates some measured and calculated values that may be used in some embodiments as reference values. In some embodiments, the above test procedures may be used to determine reference current and energy levels. For example, in a test that resulted in the values shown in the table of FIG. 8, the reference current level is determined to be 250 mA and the corresponding reference energy level is 15 nJ. In some embodiments, the above test procedures may be used for measuring current levels and calculating the energy levels of an ESD event and then comparing the current levels and energy levels with the reference current and energy levels respectively.

It can be appreciated that the embodiments of the invention provide many advantages. For example, these tests and values may be used as guidelines for the industry and standards organizations i.e. ISO/IEC and EMV.

Figure 10:
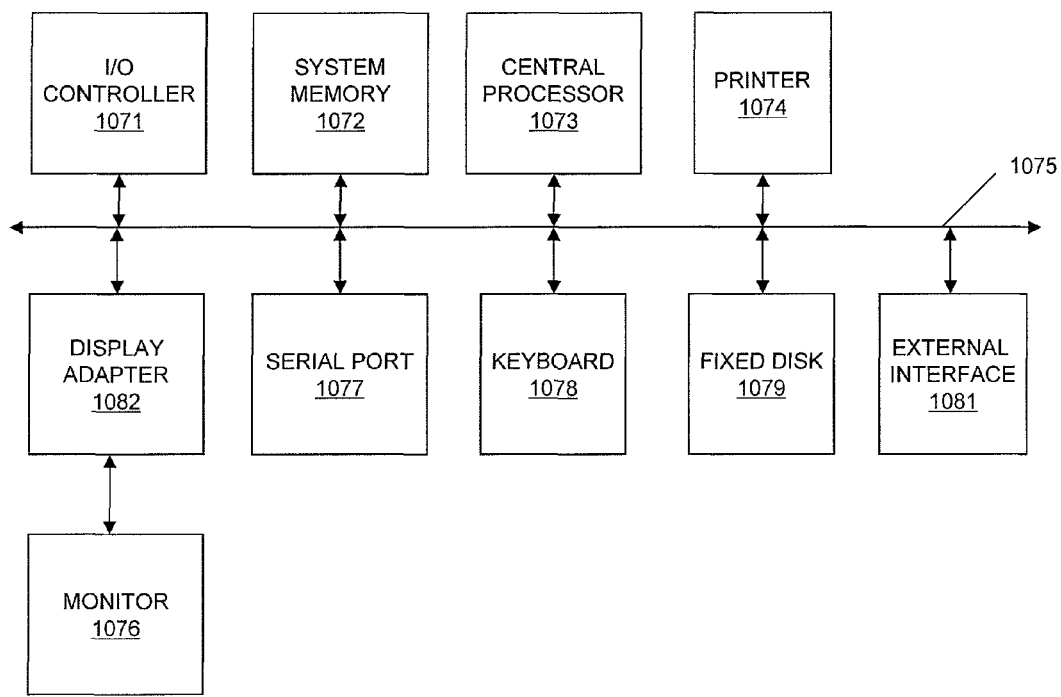
FIG. 10 shows a system, according to an embodiment of the invention.

The various participants and elements used to perform the above test procedure may operate one or more components in one or more computer apparatuses (e.g., computer system 111) to facilitate the functions described herein. Any of the participants and elements may use any suitable number of subsystems to facilitate the functions described herein. Examples of such subsystems or components are shown in FIG. 10. The subsystems shown in FIG. 10 are interconnected via a system bus 1075. Additional subsystems such as a printer 1074, keyboard 1078, fixed disk 1079 (or other memory comprising computer readable media), monitor 1076, which is coupled to display adapter 1082, and others are shown. Peripherals and input/output (I/O) devices, which couple to I/O controller 1071, can be connected to the computer system by any number of means known in the art, such as serial port 1077. For example, serial port 1077 or external interface 1081 can be used to connect the computer apparatus to a wide area network such as the Internet, a mouse input device, or a scanner. The interconnection via system bus allows the central processor 1073 to communicate with each subsystem and to control the execution of instructions from system memory 1072 or the fixed disk 1079, as well as the exchange of information between subsystems. The system memory 1072 and/or the fixed disk 1079 may embody a computer readable medium.

The software components or functions described in this application may be implemented as software code to be executed by one or more processors using any suitable computer language such as, for example, Java, C++ or Perl using, for example, conventional or object-oriented techniques. The software code may be stored as a series of instructions, or commands on a computer-readable medium, such as a random access memory (RAM), a read-only memory (ROM), a magnetic medium such as a hard-drive or a floppy disk, or an optical medium such as a CD-ROM. Any such computer-readable medium may also reside on or within a single computational apparatus, and may be present on or within different computational apparatuses within a system or network.

Some embodiments of the present invention can be implemented in the form of control logic in software or hardware or a combination of both. The control logic may be stored in an information storage medium as a plurality of instructions adapted to direct an information processing device to perform a set of steps disclosed in embodiments of the present invention. Based on the disclosure and teachings provided herein, a person of ordinary skill in the art will appreciate other ways and/or methods to implement the present invention.

In embodiments, some of the entities described herein may be embodied by a computer that performs any or all of the functions and steps disclosed.

Any recitation of "a", "an" or "the" is intended to mean "one or more" unless specifically indicated to the contrary.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A method comprising:
    performing a first test procedure by measuring a capacitance of a payment device using a capacitance measure fixture and a capacitance meter;
    measuring a plurality of current levels after performing a second test procedure, using a charge/discharge device, a current transducer, and an oscilloscope;
    calculating a plurality of energy levels from the plurality of current levels using an energy calculation program running a computer system;
    calculating a dynamic resistance of the payment device from one of the plurality of the current levels; and
    determining a reference current level that is equal or greater than a highest of the plurality of the current levels.

2. The method of claim 1, further comprising comparing the plurality of current levels with the reference current level.

3. The method of claim 2, wherein the reference current level is 250 mA.

4. The method of claim 1, wherein the second test procedure comprises of normal insertion of the payment device into a payment terminal.

5. The method of claim 1, wherein the second test procedure comprises:

performing a pre-defined physical activity to charge the payment device with electrostatic charge; and inserting the payment device into the payment terminal.

6. The method of claim 1, wherein when the payment device is made of metal and the second test procedure comprises:

charging the payment device to 1 KV, using a charging source;

charging an operator to 1 KV, using the charging source; and inserting the payment device into charge/discharge device.

7. The method of claim 1, wherein the second test procedure comprises:

charging the payment device to 10 KV, using a charging source;

charging an operator to 1 KV, using the charging source; and inserting the payment device into the payment terminal.

8. The method of claim 1, further comprising determining a reference energy level that is equal to or greater than a highest of the plurality of the energy levels.

9. The method of claim 8, further comprising comparing the plurality of energy levels with the reference energy level.

10. The method of claim 9, wherein the reference energy level is 15 nJ.

11. The method of claim 1, further comprising placing the payment device, the charge/discharge device, the payment terminal and a plurality of test equipment in a controlled environment before measuring the capacitance of at least one component of the payment device.

12. The method of claim 1, wherein the plurality of the current levels are the result of electrostatic discharge of the payment device when inserted into the charge/discharge device.

13. The method of claim 1, wherein the payment device is a payment card.

14. The method of claim 1, further comprising rubbing a payment device against a plurality of types of clothing materials and each time measuring a current level using a payment terminal that is known to be sensitive to electrostatic discharge, a current transducer and an oscilloscope.

15. The method of claim 14, wherein the plurality of types of clothing materials include cotton, nylon, wool, and leather.

16. A system comprising:

a charge/discharge device; and an oscilloscope coupled to the charge/discharge device and configured to generate a comma separated values ("CSV") data file when a payment device is inserted into a payment terminal.

17. The system of claim 16, further comprising a current transducer coupled to the charge/discharge device and configured to measure a current when the payment device is inserted into the charge/discharge device.

18. The system of claim 16, further comprising a charging source adapted to charge the payment device to a pre-specified voltage.

19. The system of claim 16, further comprising a charging source adapted to charge an operator to a pre-specified voltage.

20. The system of claim 16, wherein the payment device is a payment card.

21. The system of claim 16, wherein the system is configured to measure a plurality of current levels using the current transducer and the oscilloscope.

22. The system of claim 16, wherein an energy levels is calculated from the current level.

23. The system of claim 22, further comprising a computer system coupled to the oscilloscope and configured to receive the CSV data file from the oscilloscope and calculate the energy level using an energy calculation program stored on and executed by the computer system.

* * * * *